United States Patent
Itakura

(10) Patent No.: US 12,261,271 B2
(45) Date of Patent: Mar. 25, 2025

(54) MANAGEMENT DEVICE AND POWER STORAGE SYSTEM

(71) Applicant: Panasonic Intellectual Property Management Co., Ltd., Osaka (JP)

(72) Inventor: Yusuke Itakura, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 574 days.

(21) Appl. No.: 17/633,361

(22) PCT Filed: Jul. 21, 2020

(86) PCT No.: PCT/JP2020/028182
§ 371 (c)(1),
(2) Date: Feb. 7, 2022

(87) PCT Pub. No.: WO2021/033480
PCT Pub. Date: Feb. 25, 2021

(65) Prior Publication Data
US 2022/0294028 A1    Sep. 15, 2022

(30) Foreign Application Priority Data
Aug. 22, 2019  (JP) .................................. 2019-152148

(51) Int. Cl.
H01M 10/42   (2006.01)
H01M 10/48   (2006.01)
H01M 50/583  (2021.01)

(52) U.S. Cl.
CPC ......... *H01M 10/425* (2013.01); *H01M 10/48* (2013.01); *H01M 50/583* (2021.01); *H01M 2010/4271* (2013.01)

(58) Field of Classification Search
None
See application file for complete search history.

(56) References Cited

FOREIGN PATENT DOCUMENTS

JP     2018-166388     10/2018

OTHER PUBLICATIONS

Machine translation of JP 2018-166388, published on Oct. 25, 2018 (Year: 2018).*
International Search Report of PCT application No. PCT/JP2020/028182 dated Sep. 29, 2020.

* cited by examiner

*Primary Examiner* — Anca Eoff
(74) *Attorney, Agent, or Firm* — Rimon P.C.

(57) ABSTRACT

In a management device that manages a power storage module in which a plurality of cell blocks in which a plurality of cells are connected in parallel are connected in series, a voltage detector detects a voltage of each of the plurality of cell blocks connected in series. The controller calculates a change value of a voltage of each of the plurality of cell blocks for a certain period of time, integrates absolute values of calculated voltage change values for each of the cell blocks, and determines presence or absence of a cell block including a separated cell that is electrically separated based on an integration value of voltage changes for each of the plurality of cell blocks.

5 Claims, 5 Drawing Sheets

MANAGEMENT DEVICE AND POWER STORAGE SYSTEM

TECHNICAL FIELD

The present invention relates to a management device that manages a multiple series-parallel power storage module and relates to a power storage system.

BACKGROUND ART

In recent years, secondary batteries, such as lithium-ion batteries and nickel-metal-hydride batteries, have been used for various uses. The second batteries are used for on-vehicle uses of supplying power to a drive motor of an electric vehicle (EV), a hybrid electric vehicle (HEV), a plug-in hybrid vehicle (PHV), an electric motorcycle, or an electric bicycle, power storage uses of peak-shift or backup, frequency regulation (FR) uses of system frequency stabilization, and the like. As a power storage module used for these uses, a multiple series-parallel power storage module in which a plurality of cell blocks in which a plurality of cells are connected in parallel are connected in series has come into widespread use.

In the multiple parallel-series power storage module, even when a fuse connected to one cell constituting a cell block is blown, it is difficult to rapidly detect the fuse blowout. The voltage of the cell block does not rapidly drop due to the capacities of other cells connected in parallel with the cell having a blown fuse.

As a method for detecting fuse blowout in a multiple parallel-series power storage module, the following method has been proposed (see, for example, PTL 1). A voltage change ratio of each cell block with respect to an integration amount of discharge current is obtained, and a difference between the voltage change ratio of a cell block of a determination object and the voltage change ratio of other cell block groups is obtained. When the difference is larger than the value at the end of the previous traveling, it is determined that fuse blowout has occurred.

CITATION LIST

Patent Literature

PTL 1: Unexamined Japanese Patent Publication No. 2018-166388

SUMMARY OF THE INVENTION

In the above method, it is necessary to integrate the discharge current to some extent in order to obtain a significant voltage change ratio. In a state where sufficient discharge is not performed, determination accuracy of fuse blowout decreases. In a case where a setting is made such that determination of fuse blowout is not performed until sufficient discharge is performed in order to prevent erroneous determination, when discharge with a shallow discharge depth is repeated, a state where determination of fuse blowout cannot be performed is continued.

The present disclosure has been made in view of such a situation, and an object of the present disclosure is to provide a technique for early detecting separation of a cell from a cell block due to fuse blowout or the like.

In order to solve the above problem, a management device according to an aspect of the present disclosure is a management device that manages a power storage module in which a plurality of cell blocks in which a plurality of cells are connected in parallel are connected in series, the management device including: a voltage detector that detects a voltage of each of the plurality of cell blocks connected in series; and a controller that calculates a change value of a voltage of each of the plurality of cell blocks for a certain period of time, integrates absolute values of calculated voltage change values for each of the plurality of cell blocks, and determines presence or absence of a cell block including a separated cell that is electrically separated based on an integration value of voltage changes for each of the plurality of cell blocks.

Note that an arbitrary combination of the above configuration elements and the expression of the present invention converted among methods, devices, systems, and the like are also valid as an aspect of the present invention.

According to the present disclosure, separation of a cell from a cell block due to fuse blowout or the like can be detected early.

DESCRIPTION OF EMBODIMENT

Figure 1:
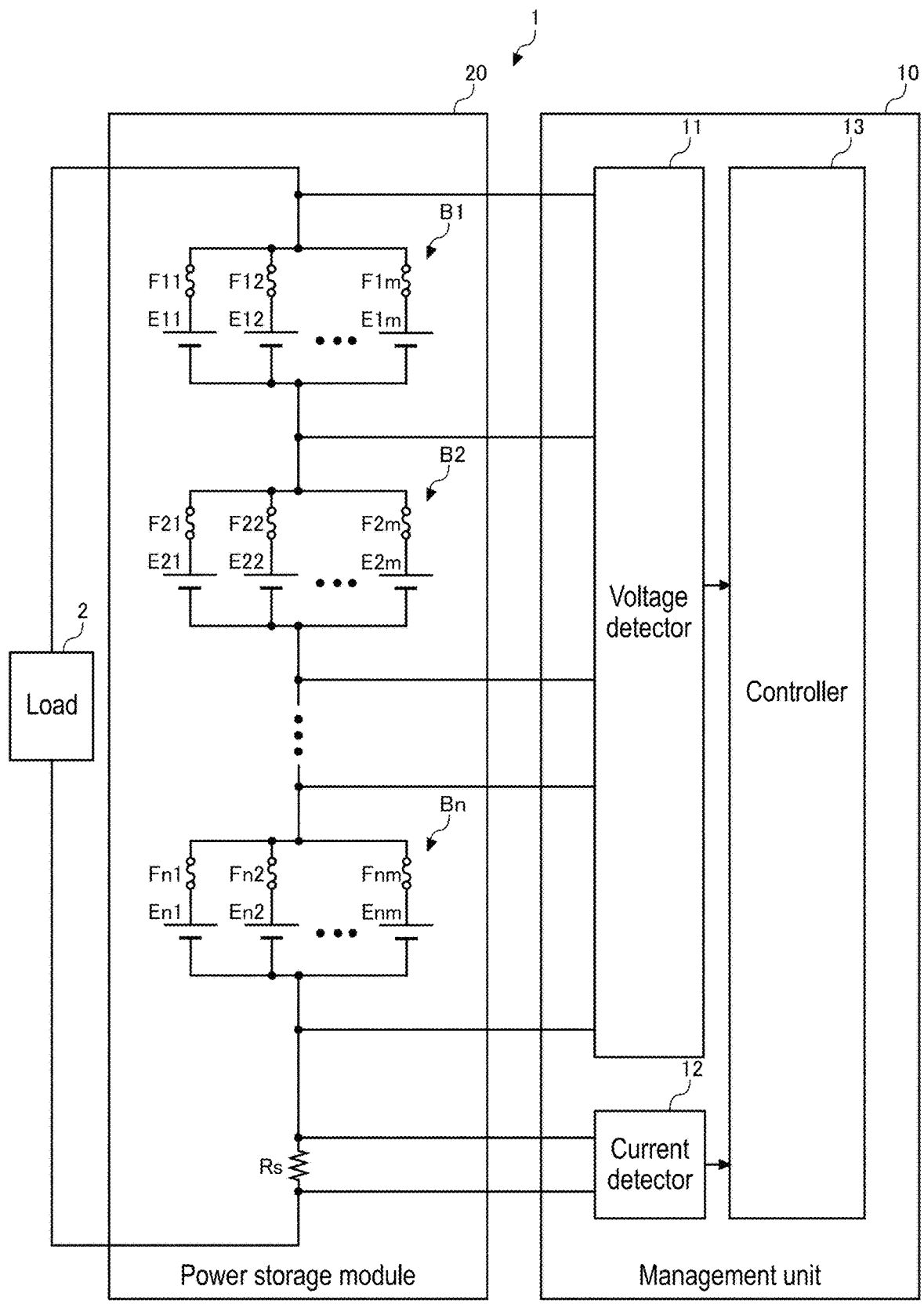
FIG. 1 is a view for describing a power storage system according to an exemplary embodiment.

FIG. 1 is a view for describing power storage system 1 according to an exemplary embodiment. Power storage system 1 includes power storage module 20 and management unit 10. Power storage module 20 is connected to load 2. For example, in a case of on-vehicle uses, load 2 is a running motor. In this case, an inverter (not illustrated) is connected between power storage module 20 and load 2. At the time of power running, DC power discharged from power storage module 20 is converted into AC power by the inverter and supplied to a running motor. At the time of regeneration, AC power generated by the running motor is converted into DC power by the inverter and charged into power storage module 20. Note that a rechargeable configuration by plug-in from an external charger may be adopted.

In a case of power storage module 20 of a stationary type for peak-cut/backup use, load 2 is a load of a commercial power system and an AC load. In this case, a power conditioner is connected between power storage module 20 and load 2. At the time of charging power storage module 20, AC power supplied from the commercial power system is converted into DC power by the power conditioner and charged into power storage module 20. At the time of discharging power storage module 20, DC power discharged from power storage module 20 is converted into AC power by the power conditioner and supplied to the AC load.

Power storage module 20 includes n (n is an integer of 2 or greater) cell blocks B1, B2, ..., Bn connect in series in which m (m is an integer of 2 or greater) cells E11-1$m$, E21-2$m$, ..., En1-nm are connected in parallel.

Cells E11-1$m$, E21-2$m$, ..., En1-nm are lithium-ion battery cells, nickel-metal-hydride battery cells, lead battery cells, electric double-layer capacitor cells, lithium-ion capacitor cells, or the like. Hereinafter, the present exemplary embodiment assumes an example with one cell block configured with 20 to 50 cylindrical lithium-ion batteries (nominal voltage: 3.6 V to 3.7 V) connected in parallel.

Fuses F11-1$m$, F21-2$m$, ..., and Fn1-nm are connected in series respectively between high-voltage side node of respective cell blocks B1, B2, ..., and Bn and positive-electrode terminals of cells E11-1$m$, E21-2$m$, ..., and En1-nm included in respective cell blocks B1, B2, ..., and Bn. Note that fuses F11-1$m$, F21-2$m$, ..., and Fn1-nm may be connected in series respectively between low-voltage side node of respective cell blocks B1, B2, ..., and Bn and negative-electrode terminals of cells E11-1$m$, E21-2$m$, ..., and En1-nm included in respective cell blocks B1, B2, ..., and Bn.

Shunt resistor Rs is connected in series with n cell blocks B1 to Bn connected in series. Shunt resistor Rs functions as a current detection element. Note that a Hall element may be used in place of shunt resistor Rs.

Management unit 10 includes voltage detector 11, current detector 12, and controller 13. Nodes of n cell blocks B1 to Bn connected in series and voltage detector 11 are connected via a plurality of voltage lines. By detecting a voltage between two adjacent voltage lines, voltage detector 11 detects a voltage of each of n cell blocks B1 to Bn. Voltage detector 11 transmits the detected voltage of each of cell blocks B1 to Bn to controller 13.

Since voltage detector 11 has a high voltage with respect to controller 13, voltage detector 11 and controller 13 are connected via a communication line in a state where voltage detector 11 and controller 13 are insulated from each other. Voltage detector 11 can be configured with an application specific integrated circuit (ASIC) or a general-purpose analog front end IC. Voltage detector 11 includes a multiplexer and an A/D converter. The multiplexer outputs the voltage between two adjacent voltage lines to the A/D converter in order from the top. The A/D converter converts an analog voltage input from the multiplexer into a digital value.

Current detector 12 includes a differential amplifier and an A/D converter. The differential amplifier amplifies the voltage at both ends of shunt resistor Rs and outputs the amplified voltage to the A/D converter. The A/D converter converts the voltage input from the differential amplifier into a digital value and outputs the digital value to controller 13. Controller 13 estimates the current flowing through n cell blocks B1 to Bn based on the digital value.

Note that in a case where an A/D converter is mounted inside controller 13 and an analog input port is provided in controller 13, current detector 12 may output the analog voltage to controller 13 and the A/D converter in controller 13 may convert the analog voltage into a digital value.

Controller 13 manages the state of n cell blocks B1 to Bn based on the voltages and the current of n cell blocks B1 to Bn detected by voltage detector 11 and current detector 12. Controller 13 can be configured with a microcomputer and a nonvolatile memory (e.g., an electrically erasable programmable read-only memory (EEPROM) or a flash memory).

As one of state management of cell blocks B1 to Bn, controller 13 determines presence or absence of a cell block including a cell (hereinafter, referred to as a separated cell) electrically separated from a plurality of cells constituting the cell block. The separated cell is typically generated when a fuse connected in series to the cell is melted due to overcurrent or the like. The separated cell is also generated when wiring of a specific cell is disconnected due to peeling of spot welding or the like. The cell block with generation of a separated cell has a lower capacity than a capacity of another normal cell block.

Controller 13 calculates a change value of a voltage of each of n cell blocks B1 to Bn for a certain period of time, integrates absolute values of calculated voltage change values for each of cell blocks B1 to Bn, and determines presence or absence of a cell block including a separated cell based on an integration value of voltage changes of cell blocks B1 to Bn. A detailed description will be given below.

Figure 2:
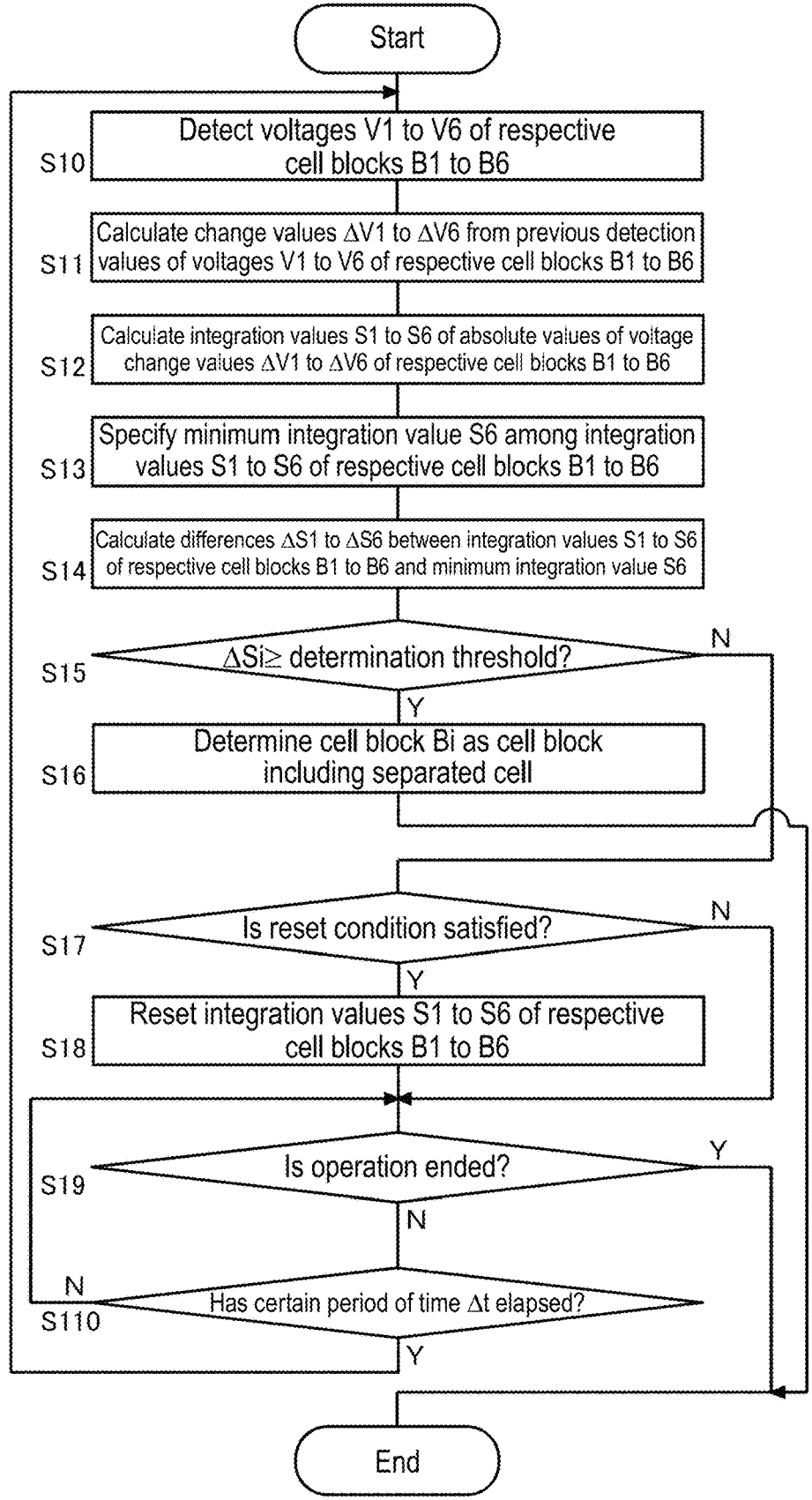
FIG. 2 is a flowchart showing an example of processing of determining presence or absence of a cell block including a separated cell according to the exemplary embodiment.

FIG. 2 is a flowchart showing an example of processing of determining presence or absence of a cell block including a separated cell according to the exemplary embodiment. In the present processing example, power storage module 20 with six cell blocks B1 to B6 connected in series will be described as an example.

Voltage detector 11 detects respective voltages V1 to V6 of six cell blocks B1 to B6 connected in series, and transmits voltages V1 to V6 to controller 13 (S10). Controller 13 detects respective change values ΔV1 to ΔV6 of voltages V1 to V6 of respective cell blocks B1 to B6 from previous detection values (S11).

Figure 3:
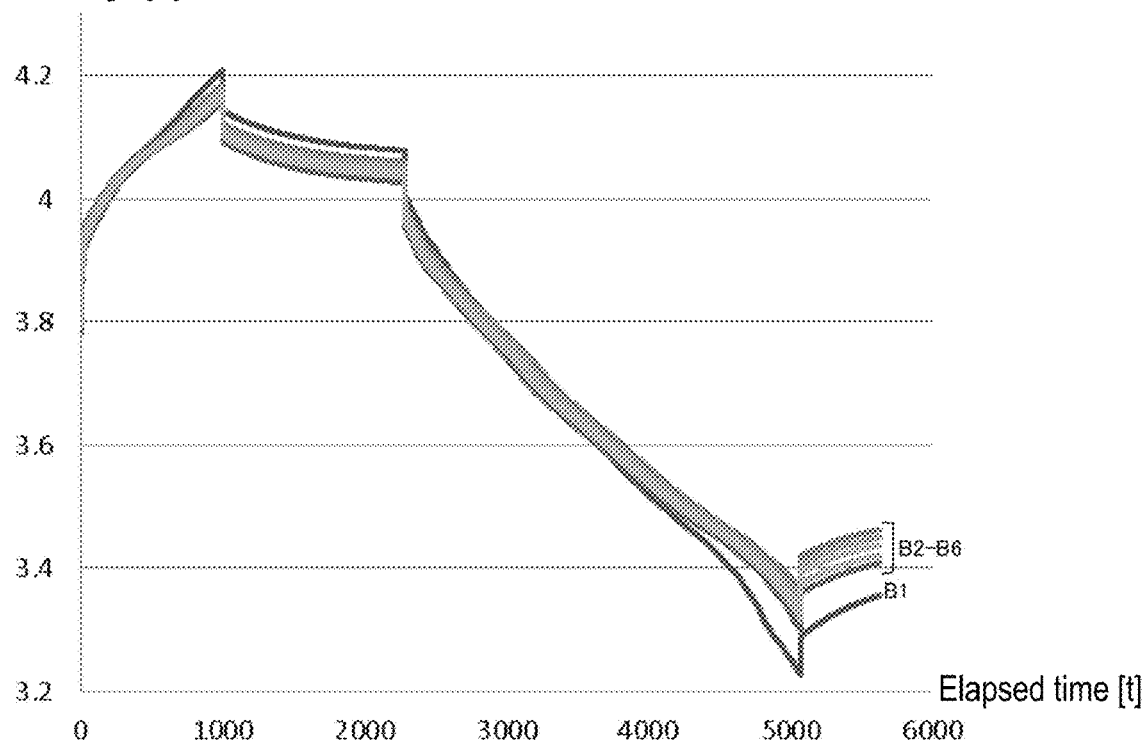
FIG. 3 is a view showing an example of voltage time transition of cell blocks.
Figure 4:
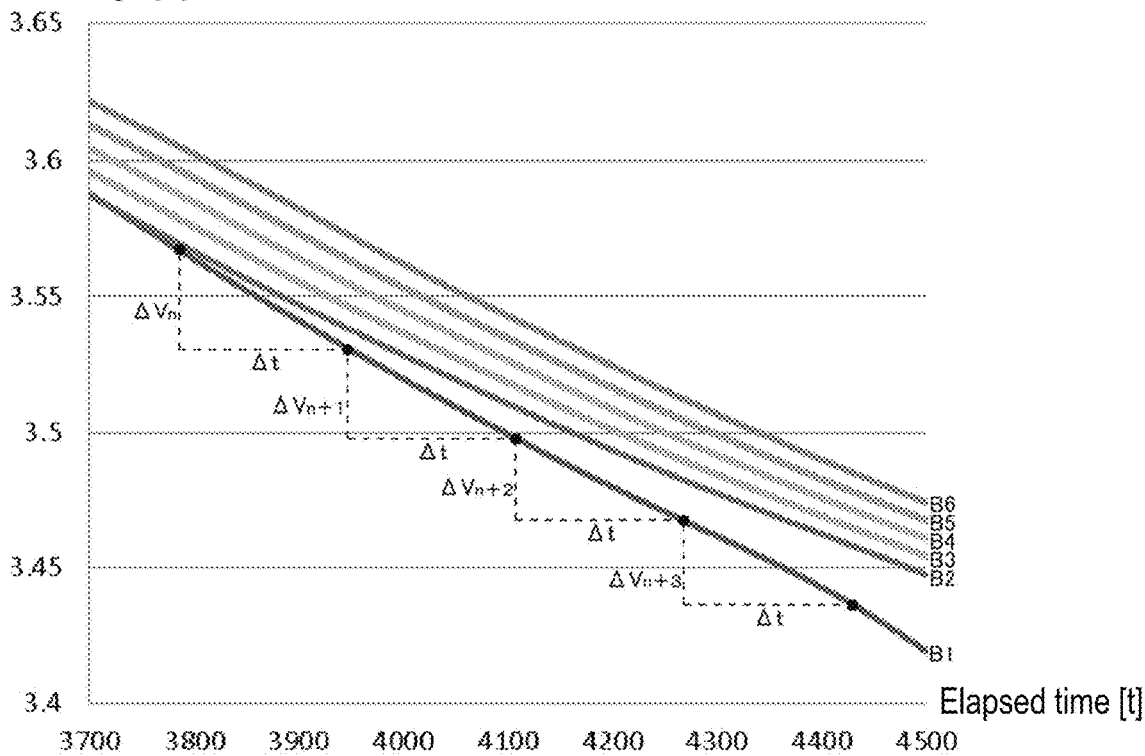
FIG. 4 is an enlarged view of the voltage time transition of the cell blocks in FIG. 3 in a section of 3700 seconds to 4500 seconds.

FIG. 3 is a view showing an example of voltage time transition of cell blocks B1 to B6. FIG. 4 is an enlarged view of the voltage time transition of cell blocks B1 to B6 in FIG. 3 in a section of 3700 seconds to 4500 seconds. A period where the voltages of cell blocks B1 to B6 increase is a period where power storage module 20 is charged, and a period where the voltages of cell blocks B1 to B6 decrease is a period where power storage module 20 is discharged.

FIGS. 3 and 4 show an example where a separated cell is generated in first cell block B1 and a separated cell is not generated in second cell block B2 to sixth cell block B6. In first cell block B1 including the separated cell, the number of parallel connections of cells decreases, and the maximum capacity becomes small. Accordingly, in first cell block B1 including the separated cell, voltage fluctuation when the remaining capacity changes becomes large as compared with second cell block B2 to sixth cell block B6 not including the separated cell.

The description returns to FIG. 2. Controller 13 calculates respective integration values S1 to S6 of the absolute values of voltage change values ΔV1 to ΔV6 of respective cell blocks B1 to B6 (S12). Controller 13 specifies the minimum value among integration values S1 to S6 of the voltage changes of respective cell blocks B1 to B6 (S13). The example shown in the present flowchart assumes that the minimum integration value is integration value S6 of sixth cell block B6. Controller 13 calculates respective differences ΔS1 to ΔS6 between integration values S1 to S6 of respective cell blocks B1 to B6 and minimum integration value S6 (S14). Note that calculation of difference ΔS6 between integration value S6 of sixth cell block B6 and minimum integration value S6 may be omitted.

Figure 5:
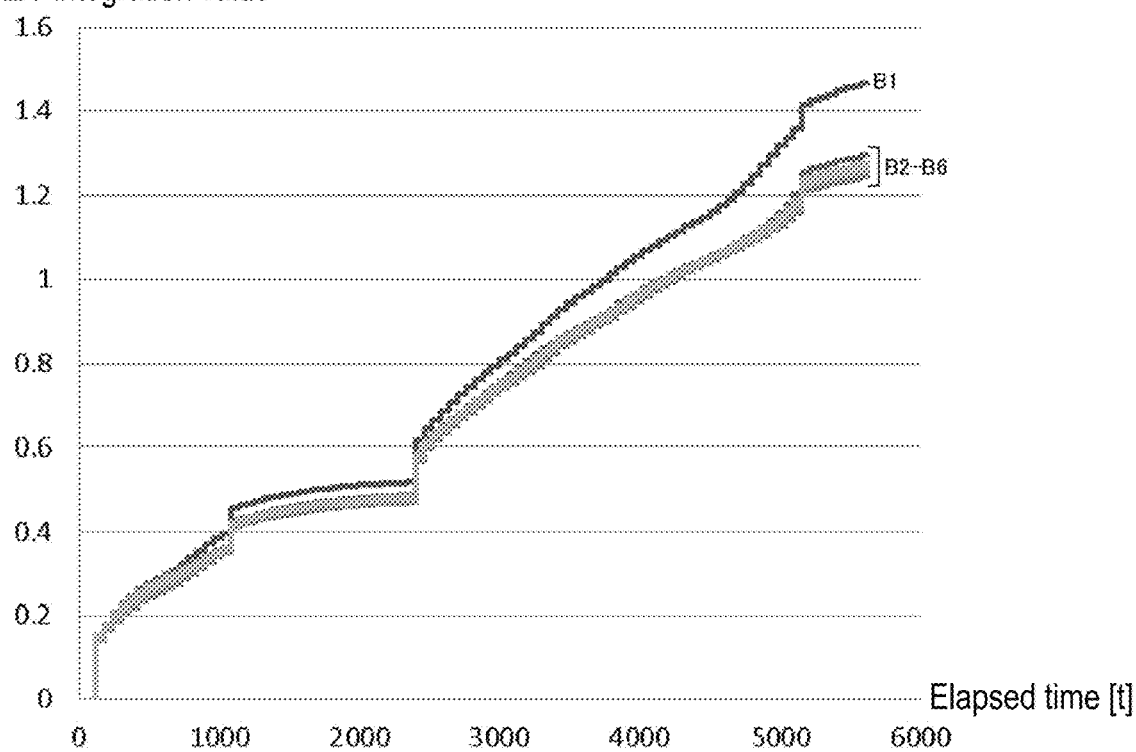
FIG. 5 is a view showing an example of time transition of integration values of voltage changes of cell blocks.

FIG. 5 is a view showing an example of time transition of integration values S1 to S6 of the voltage changes of cell blocks B1 to B6. As the cumulative charge/discharge period of power storage module 20 increases, integration value S1 of the voltage change of first cell block B1 including the separated cell gradually deviates upward with respect to integration values S2 to S6 of the voltage changes of other second cell block B2 to sixth cell block B6 not including the separated cell.

Figure 6:
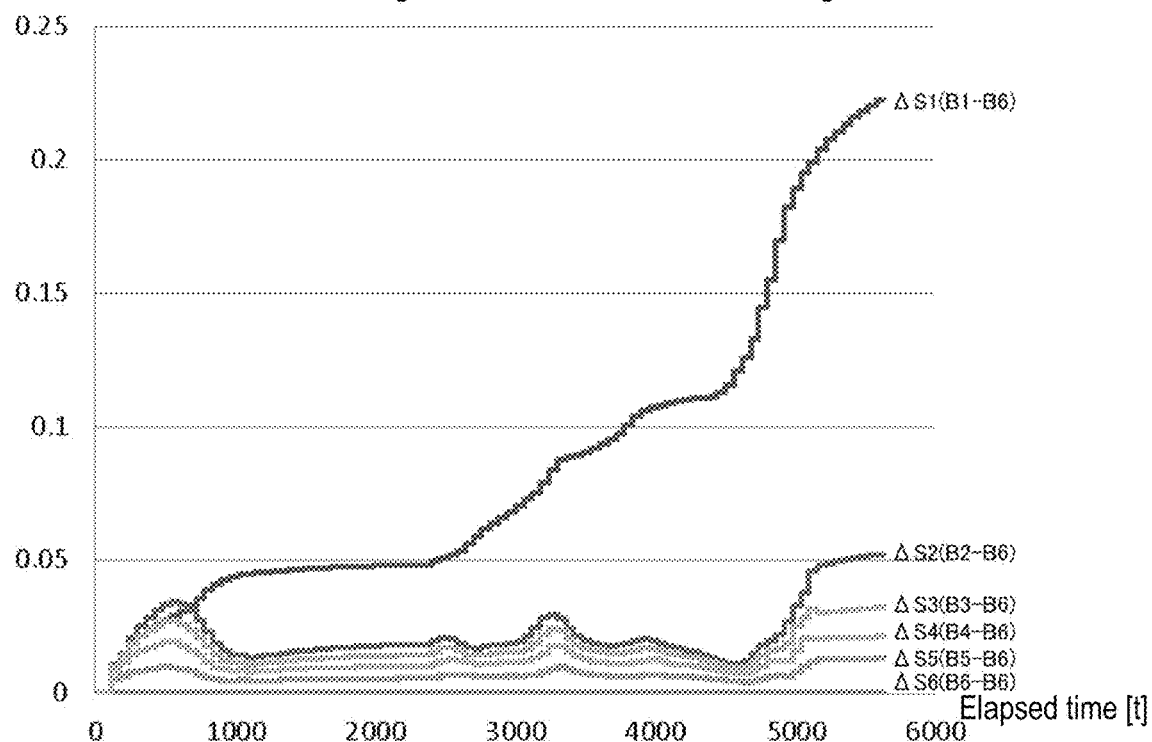
FIG. 6 is a view showing an example of time transition of differences between respective integration values of cell blocks and a minimum integration value.

FIG. 6 is a view showing an example of time transition of differences ΔS1 to ΔS6 between respective integration values S1 to S6 of cell blocks B1 to B6 and minimum integration value S6. As the cumulative charge/discharge period of power storage module 20 increases, difference ΔS1 between integration value S1 of first cell block B1 including the separated cell and minimum integration value S6 gradually deviates upward with respect to differences ΔS2 to ΔS6 between integration values S2 to S6 of other second cell block B2 to sixth cell block B6 and minimum integration value S6.

The description returns to FIG. 2. Controller 13 compares difference ΔSi (i=1 to the number of series connections) between each of integration values S1 to S6 of cell blocks B1 to B6 and minimum integration value S6 with a determination threshold (S15). The determination threshold is a threshold for determining whether or not a cell block includes a separated cell. An appropriate value of the determination threshold depends on a specification of a cell, the number of parallel connections of cells, the number of series connections of cell blocks, and a use condition. The designer derives a determination threshold to be used based on an experiment or simulation based on these parameters.

Controller 13 determines, as a cell block including a separated cell, the cell block (Y in S15) with difference ΔSi from minimum integration value S6 that is more than or equal to the determination threshold (S16). Controller 13 determines, as a cell block not including a separated cell, the cell block (N in S15) with difference ΔSi from minimum integration value S6 that is less than the determination threshold (S16 is skipped).

Controller 13 determines whether or not a reset condition of integration values S1 to S6 of cell blocks B1 to B6 has been satisfied (S17). When the reset condition is satisfied (Y in S17), controller 13 resets integration values S1 to S6 of cell blocks B1 to B6 (S18). When the reset condition is not satisfied (N in S17), step S18 is skipped.

The reset condition may be a temporal condition or may be a capacitive condition. For example, a setting where integration values S1 to S6 of cell blocks B1 to B6 are reset at a predetermined time once a day or once every several days may be used. For example, a setting where the integration value of the current detected by current detector 12 is reset at a time point when the integration value reaches a capacity corresponding to a state of charge (SOC) use range (e.g., 20% to 80%) of power storage module 20 may be used.

When the operation of power storage system 1 has ended (Y in S19), controller 13 ends the determination processing of the cell block including the separated cell. When the operation of power storage system 1 has not ended (N in S19), when certain period of time Δt has elapsed (Y in S110), the processing proceeds to step S10, and the processing of step S10 to step S18 are repeated. Certain period of time Δt is set, for example, between 1 minute and 5 minutes. When certain period of time Δt is as short as less than 100 milliseconds, the influence of an error of the change value calculated for each certain period of time Δt of the voltage of each of the plurality of cell blocks increases. When certain period of time Δt is as long as more than or equal to one hour, the number of times of integration of the voltage change values of each of the cell blocks per predetermined time decreases, so that the time required to obtain an integration value of the voltage change of each of the cell blocks required to detect the cell separation becomes long. Therefore, it is preferable to set certain period of time Δt between several hundred milliseconds and less than one hour.

As described above, according to the present exemplary embodiment, it is possible to early detect separation of a cell from a cell block due to fuse blowout or the like. That is, by integrating the voltage change values for each certain period of time for each cell block, it is possible to emphasize a slight difference between the voltage of the cell block including the separated cell and the voltage change of the cell block not including the separated cell. Controller 13 only needs to hold the voltage value of each cell block one cycle before and the integration value of the voltage change of each cell block, and a load on the system is small and introduction is easy.

In the method disclosed in PTL 1, a voltage change due to charging is not considered in determination of fuse blowout. Therefore, when the fuse is melted immediately before the end of discharging, the fuse is detected after the end of the next discharging after the next charging, and detection of fuse blowout has been delayed. On the other hand, according to the present exemplary embodiment, since a voltage change for each certain period of time is integrated with an absolute value, generation of a separated cell can be detected early without distinguishing between charge and discharge.

In the method disclosed in PTL 1, a difference between the voltage change ratio of a cell block of a determination object and the voltage change ratio of a normal cell block group is obtained at the end of traveling. Fuse blowout is determined based on a change in the difference at the time of the previous traveling end and the difference at the time of the current traveling end. In this method, it becomes necessary to integrate the discharge current to some extent in order to obtain a significant voltage change ratio. In a state where discharge is not sufficiently performed, determination accuracy of fuse blowout decreases. In a case where a setting is made such that determination of fuse blowout is not performed until sufficient discharge is performed in order to prevent erroneous determination, when discharge with a shallow discharge depth is repeated, a state where determination of fuse blowout cannot be performed is continued.

On the other hand, according to the present exemplary embodiment, since determination of a cell block including a separated cell is constantly performed for each certain period of time, the generation of the separated cell can be detected early after the separated cell is generated. Even in a case where discharge with a shallow discharge depth is repeated, generation of a separated cell can be detected when the integration value of the charge/discharge amount reaches a certain value.

The present disclosure has been described above based on the exemplary embodiment. It is to be understood by the person of ordinary skill in the art that the exemplary embodiment is an example, various modified examples are possible for combinations of configuration elements and processing processes, and such modified examples also in the scope of the present disclosure.

In the above exemplary embodiment, an example where the minimum value among n integration values S1 to Sn is used as a reference value to be compared with integration values S1 to Sn of the voltage changes of n cell blocks B1 to Bn has been described. In this regard, an average value or a median value of n integration values S1 to Sn may be used as a reference value. When the average value or the median of n integration values S1 to Sn is calculated, the maximum value and the minimum value may be removed from n integration values S1 to Sn.

Figure 7:
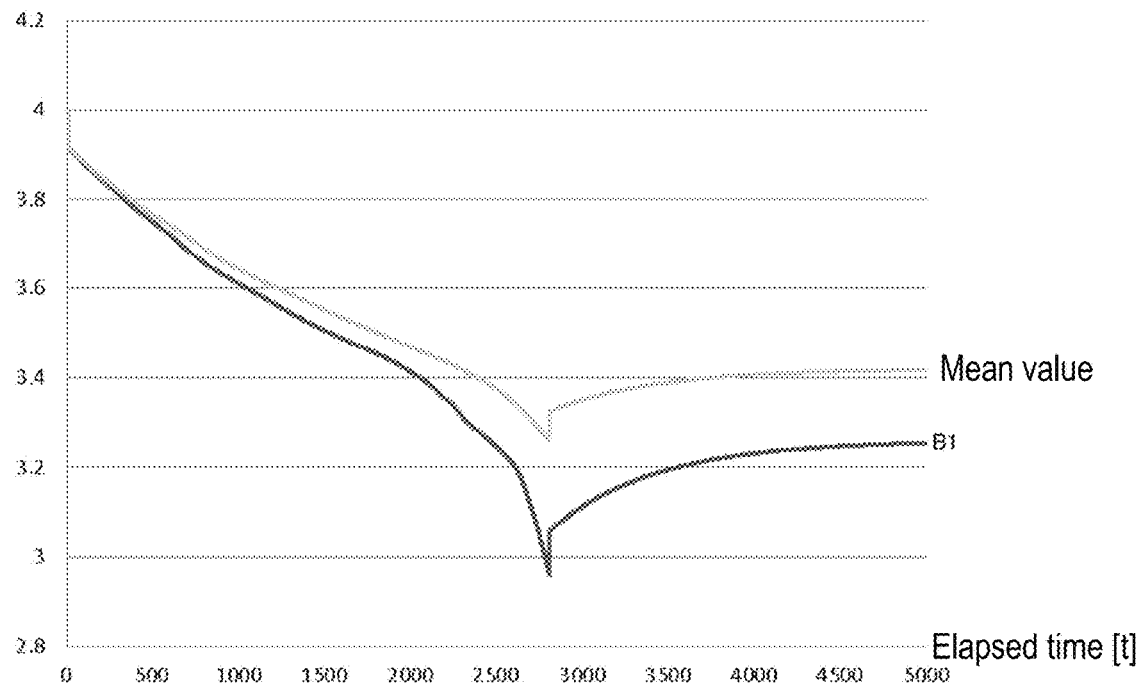
FIG. 7 is a view showing an example of time transition of a voltage of a first cell block and an average voltage of n cell blocks.
Figure 8:
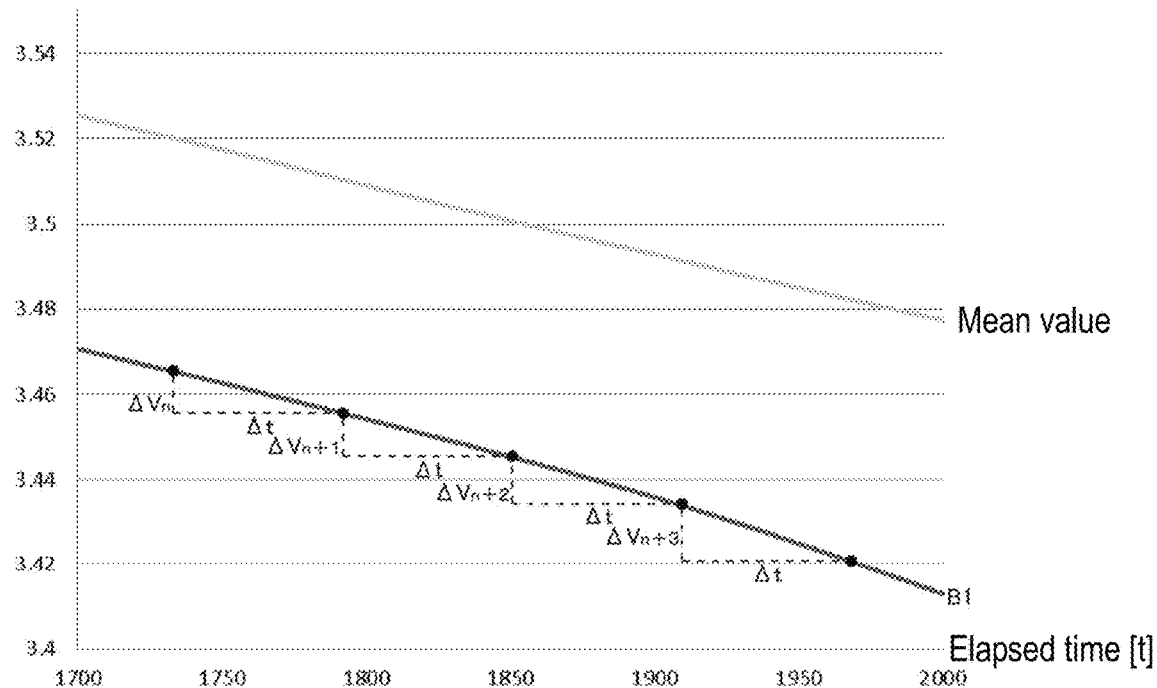
FIG. 8 is an enlarged view of time transition of the voltage of the first cell block in FIG. 7 and the average voltage of the n cell blocks in a section of 1700 seconds to 2000 seconds.

FIG. 7 is a view showing an example of time transition of the voltage of first cell block B1 and the average voltage of n cell blocks B1 to Bn. FIG. 8 is an enlarged view of time transition of the voltage of first cell block B1 in FIG. 7 and the average voltage of n cell blocks B1 to Bn in a section of 1700 seconds to 2000 seconds.

FIGS. 7 and 8 show an example where a separated cell is generated in first cell block B1 and a separated cell is not generated in the other cell blocks. In the normal cell block, even if the remaining capacity changes due to charging/discharging, the voltage difference from the average voltage of n cell blocks B1 to Bn does not greatly change. On the other hand, in the cell block including a separated cell, the voltage difference from the average voltage greatly changes when the remaining capacity changes.

Note that the exemplary embodiment may be specified by the following items.

[Item 1]

Management device (10) that manages power storage module (20) in which a plurality of cell blocks (B1, B2, . . . , Bn) in which a plurality of cells (E11-1m, E21-2m, . . . , En1-nm) are connected in parallel are connected in series, management device (10) including:

voltage detector (11) that detects a voltage of each of the plurality of cell blocks (B1, B2, . . . , Bn) connected in series; and controller (13) that calculates a change value of a voltage of each of the plurality of cell blocks (B1, B2, . . . , Bn) for a certain period of time, integrates absolute values of calculated voltage change values for each of the plurality of cell blocks (B1, B2, . . . , Bn), and determines presence or absence of cell block (B1) including a separated cell that is electrically separated based on an integration value of voltage changes for each of the plurality of cell blocks (B1, B2, . . . , Bn).

According to this, it is possible to early detect cell block (B1) including the separated cell.

[Item 2]

Management device (10) according to item 1, wherein controller (13) determines, as a cell block including the separated cell, cell block (B1) including an integration value with a difference from a minimum value more than or equal to a threshold among integration values of the plurality of cell blocks (B1, B2, . . . , Bn).

According to this, it is possible to specify the cell block including a separated cell from a difference in the voltage behavior between cell blocks.

[Item 3]

Management device (10) according to item 1, wherein controller (13) determines, as a cell block including the separated cell, cell block (B1) including an integration value with a difference from an average value or a median value more than or equal to a threshold among integration values of the plurality of cell blocks (B1, B2, . . . , Bn).

According to this, it is possible to specify the cell block including a separated cell from a difference in the voltage behavior between cell blocks.

[Item 4]

Management device (10) according to any one of items 1 to 3, wherein a plurality of fuses (F11-1m, F21-2m, . . . , Fn1-nm) are respectively connected in series with a plurality of cells (E11-1m, E21-2m, . . . , En1-nm) constituting each of the plurality of cell blocks (B1, B2, . . . , Bn), and when one of the plurality of fuses is melted, a cell connected in series with the fuse becomes the separated cell.

According to this, it is possible to early detect fuse blowout.

[Item 5]

Power storage system (1) including:

power storage module (20) in which a plurality of cell blocks (B1, B2, . . . , Bn) in which a plurality of cells (E11-1m, E21-2m, . . . , En1-nm) are connected in parallel are connected in series; and management device (10) according to any one of items 1 to 4 that manages power storage module (20).

According to this, it is possible to construct power storage system (1) that can early detect cell block (B1) including a separated cell.

REFERENCE MARKS IN THE DRAWINGS

1: power storage system
2: load
10: management unit
11: voltage detector
12: current detector
13: controller
20: power storage module
B1-Bn: cell block
E11-Enm: cell
F11-Fnm: fuse
Rs: shunt resistor

The invention claimed is:

1. A management device managing a power storage module including a plurality of cell blocks connected in series, each cell block of the plurality of cell blocks includes a plurality of cells connected in parallel, the management device comprising:

a voltage detector that detects a voltage of each of the plurality of cell blocks; and a controller that performs, for each of the plurality of cell blocks:

calculating a change value of a voltage for each of the plurality of cell blocks for a certain period of time each being the voltage detected by the voltage detector;

integrating absolute values of change values to obtain an integration value, the change values each being the change value calculated; and determining, based on the integration value, whether or not any cell block of the plurality of cell blocks includes a separated cell that is electrically separated among the plurality of cells.

2. The management device according to claim 1, wherein the controller determines, as a cell block including the separated cell, a cell block including an integration value with a difference from a minimum value more than or equal to a threshold among the integration values of the plurality of cell blocks.

3. The management device according to claim 1, wherein the controller determines, as a cell block including the separated cell, a cell block including an integration value with a difference from an average value or a median value more than or equal to a threshold among the integration values of the plurality of cell blocks.

4. The management device according to claim 1, wherein a plurality of fuses are respectively connected in series with the plurality of cells constituting each of the plurality of cell blocks, and when one of the plurality of fuses is melted, a cell connected in series with the fuse becomes the separated cell.

5. A power storage system comprising:

the management device according to claim 1 managing a power storage module; and the power storage module including the plurality of cell blocks connected in series, wherein each cell block of the plurality of cell blocks includes the plurality of cells connected in parallel.

* * * * *